United States Patent [19]
Zhou

[11] Patent Number: 5,770,943
[45] Date of Patent: Jun. 23, 1998

[54] METHOD FOR MEASURING AND COMPENSATING FOR SPATIALLY AND TEMPORALLY VARYING MAGNETIC FIELDS INDUCED BY EDDY CURRENTS

[75] Inventor: Xiaohong Zhou, Pewaukee, Wis.

[73] Assignee: General Electric Company, Waukesha, Wis.

[21] Appl. No.: 777,561

[22] Filed: Dec. 30, 1996

[51] Int. Cl.[6] ...................................................... G01V 3/00
[52] U.S. Cl. ........................................... 324/307; 324/320
[58] Field of Search .................................. 324/307, 309, 324/300, 312, 314, 318, 319, 320

[56] References Cited

U.S. PATENT DOCUMENTS

| 4,591,789 | 5/1986 | Glover et al. | 324/307 |
| 4,698,591 | 10/1987 | Glover et al. | 324/307 |
| 4,950,994 | 8/1990 | Glover et al. | 324/320 |
| 5,498,963 | 3/1996 | Schneider et al. | 324/309 |
| 5,539,316 | 7/1996 | Sukumar | 324/320 |

*Primary Examiner*—Louis M. Arana
*Attorney, Agent, or Firm*—Quarles & Brady

[57] ABSTRACT

A calibration scan is used to acquire a test data set from which eddy currents induced by a test gradient pulse can be both spatially and temporally resolved. Compensation parameters are calculated and used to offset the measured eddy currents.

5 Claims, 5 Drawing Sheets

METHOD FOR MEASURING AND COMPENSATING FOR SPATIALLY AND TEMPORALLY VARYING MAGNETIC FIELDS INDUCED BY EDDY CURRENTS

BACKGROUND OF THE INVENTION

The field of the invention is nuclear magnetic resonance imaging methods and systems. More particularly, the invention relates to the measurement of and subsequent compensation for the spatially and temporally varying magnetic fields induced by eddy currents. In doing so, image distortion, signal intensity loss, ghosting, shading, and other artifacts due to eddy currents can be avoided.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned magnetic moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

The application of magnetic resonance to imaging, and to many of the techniques of localized spectroscopy, depend upon the use of linear magnetic field gradients to selectively excite particular regions and to encode spatial information within the NMR signal. During the NMR experiments, magnetic field gradient waveforms with particularly chosen temporal variations are used. Any departure from the application of ideal magnetic field gradient waveforms can, therefore, be expected to introduce image distortion, intensity loss, ghosting, and other artifacts. For example, imperfect rephasing of the nuclear spins and an attendant loss of signal occurs if the magnetic field gradients are not constant during selective time reversal pulses (i.e. use of 180° time reversal RF pulses). This effect compounds in later spin echoes of multi-echo (Carr-Purcell-Mieboom-Gill) sequences. In addition, if the gradient field is not zero when it should be (due to residual decay after termination of a gradient pulse), the unintended phase dispersion can result in distorted spectra in chemical shift imaging (CSI) sequences as well as inaccurate spin-spin relaxation time ($T_2$) determination in multi-echo sequences. Those skilled in the art are thus concerned particularly about the accuracy with which time varying magnetic field gradients are produced.

Distortion in the production of magnetic field gradients can arise if the gradient fields couple to lossy structures within the polarizing magnet such as its cryostat (if the magnet is of the superconductive design), or the shim coil system, or the RF shield used to decouple the gradient coils from the RF coil. The gradient distortions derive from induction of currents in these ambient structures and from the loss of energy to the shim coils. These induced currents are known as eddy currents. Due to eddy currents, one observes, typically an exponential rise and decay of the magnetic field gradient during and after, respectively, the application of a trapezoid current pulse to the gradient coil.

In U.S. Pat. No. 4,698,591 entitled "A Method for Magnetic Field Gradient Eddy Current Compensation," a method is disclosed which uses an analog preemphasis filter in the gradient power supply to shape the current applied to the gradient coil in such a way that the eddy current induced gradient field distortions are reduced. The filter includes a number of exponential decay components and adjustable potentiometers which must be set during system calibration. A measurement technique is used prior to system calibration in which the impulse response of the uncorrected magnetic field gradient is measured and the potentiometer settings for the pre-emphasis filter are then calculated.

It has been discovered that while such compensation of the linear magnetic field gradients improves performance of MR systems, magnetic field distortions still arise as a result of the application of pulsed linear magnetic field gradients. More specifically, measurements indicate that eddy currents which are induced by magnetic field gradient pulses not only produce an unwanted linear magnetic field gradient, but also cause temporal variations in the spatially homogeneous polarizing magnetic field $B_0$. That is, magnetic field gradient pulses cause spurious changes in the magnitude of the polarizing magnetic field $B_0$. Techniques have been developed to measure and compensate for the eddy current induced $B_0$-field changes, as described in U.S. Pat. No. 4,950,994.

The magnetic field produced by eddy currents is a complicated phenomenon due to its temporal and spatial dependencies. In order to simplify the problem, the prior corrective methods for eddy current measurement and compensation have assumed that the spatial dependency is limited to only the zeroth (i.e., the homogeneous polarizing magnetic field $B_0$) and first orders (i.e., the linear magnetic field gradients), as illustrated in U.S. Pat. Nos. 4,698,591 and 4,950,994. The higher order spatial dependencies (quadratic, cubic, etc) of the eddy current induced magnetic field are left uncompensated, producing residual image artifacts and spectroscopic degradation. Although methods have been developed to address some of the image quality problems, such as geometric distortion as described in U.S. Pat. No. 4,591,789, other problems including ghosting, shading intensity reduction, spectrum shifting, and phase errors, still remain.

SUMMARY OF THE INVENTION

The present invention is an improvement of prior methods used to measure and compensate for the eddy current induced magnetic field distortions. In doing so, the aforementioned image and spectrum quality problems are either eliminated or significantly reduced.

More specifically, the present invention includes a method for spatially and temporally resolving variations in the eddy currents that result from the application of a gradient pulse. A series of phase images are produced, and from these the spatial and time-resolved magnetic field produced by the eddy currents is calculated. From this the amplitudes and the time constants of the spatially resolved eddy current components can be calculated and used in subsequent scans to correct for the distortions that are otherwise produced.

An objective of the invention is to measure the spatial and temporal variations in eddy currents produced by a gradient pulse. This is accomplished by performing a calibration scan using a calibration pulse sequence. The calibration pulse sequence begins with a test gradient $G_{test}$, followed by a non-selective RF pulse with an optimal tip angle (i.e., the Ernst angle). The FID induced by the RF pulse is spatially encoded in 1, 2 or 3 dimensions (depending on the geometry of the phantom) using phase-encoding gradients. After spatial encoding, the FID signal continues to precess in the presence of a time-varying magnetic field produced by the eddy currents. Therefore, the temporal behavior of the eddy currents is also encoded in the FID signal. Due to the use of phase-encoding gradients, the time-varying magnetic field is caused by eddy currents arising from both $G_{test}$ and the phase-encoding gradients. In order to remove the effects of the latter, as well as the effects of the static $B_0$ field inhomogeneities, the pulse sequence is repeated, but with an opposite test gradient polarity, $-G_{test}$.

The two FID signals generated by this method can be denoted as $S_+(k_x, k_y, k_z, t_i)$ and $S_-(k_x, k_y, k_z, t_i)$, where $t_i$ represents discrete time points of the FID signal (i=1, 2, . . . N), and the other three parameters are the spatial frequencies. A multi-dimensional fast Fourier transformation (FFT) of $S_+$ and $S_-$, with $k_x$, $k_y$ and $k_z$ being the variables, produces two sets of time-resolved complex images $I_+(x,y,z,t_i)$ and $I_-(x,y,z,t_i)$. The complex images can be readily converted to phase images $\phi_+(x,y,z,t_i)$ and $\phi_-(x,y,z,t_i)$. To remove the eddy current effects arising from the phase-encoding gradients, as well as the effects of the static $B_0$ field inhomogeneities, the two sets of phase images are subtracted to produce a set of phase difference images which is directly related to the eddy currents generated by the test gradient: $\phi(x,y,z,t_i)=[\phi_+(x,y,z,t_i)-\phi_-(x,y,z,t_i)]/2$. The time derivative of $\phi(x,y,z,t_i)$ yields the temporally and spatially resolved magnetic field $B(x,y,z,t_i)$ caused by the eddy currents. A spherical harmonic decomposition of B gives the spatial distribution of the eddy current induced field at a series of time points $t_i$. Subsequent exponential curve fitting of the harmonic coefficients with time being the abscissa produces the amplitudes and the time constants of the spatially resolved eddy current components for proper compensation.

DESCRIPTION OF THE PREFERRED EMBODIMENT

Figure 1:
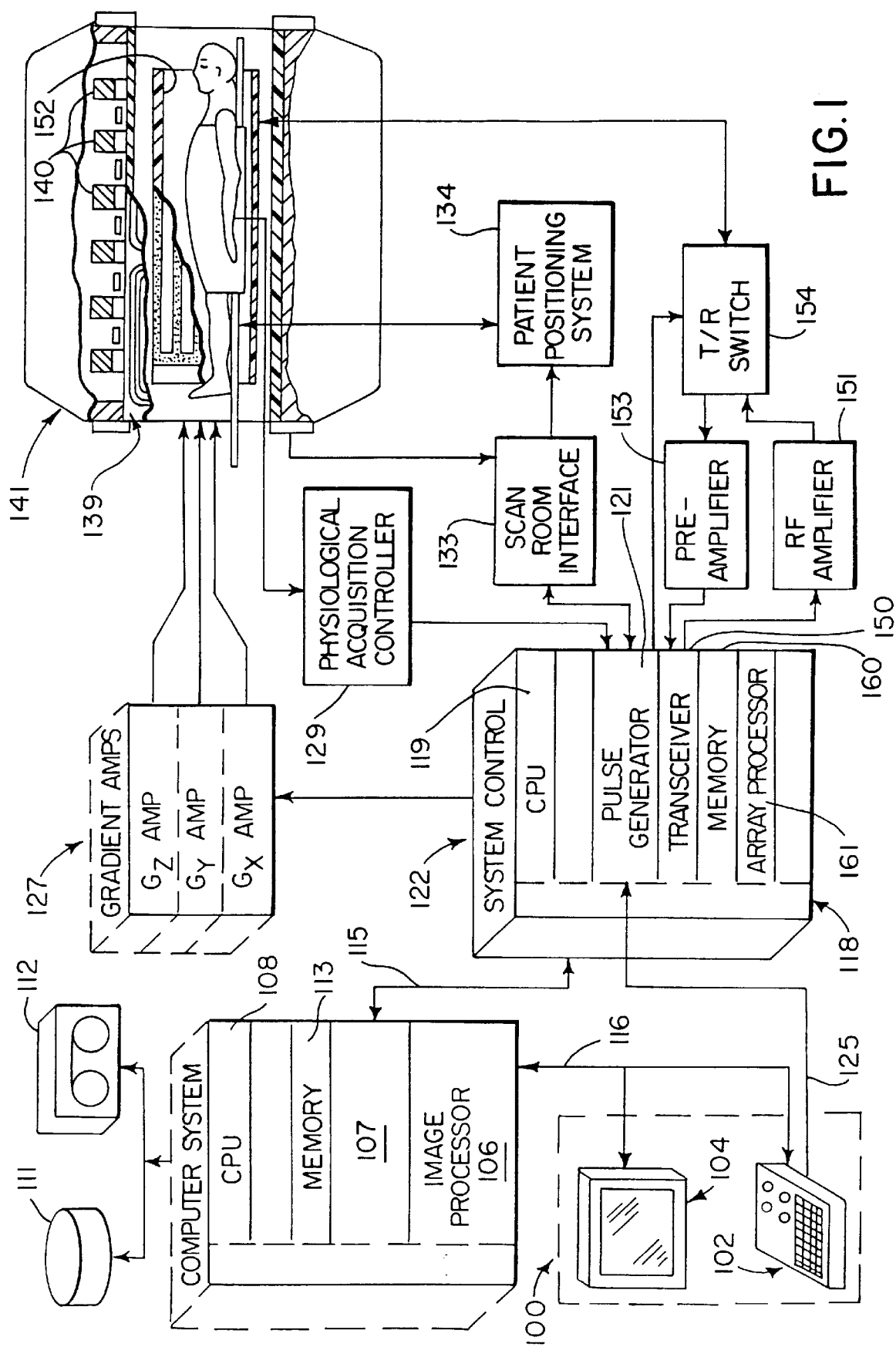
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the linear magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to transform the data into an array of image data. This image data is conveyed through the serial link 115 to the computer system 107 where it is stored in the disk memory 111. In response to commands received from the operator console 100, this image data may be archived on external drive 112, or it may be further processed by the image processor 106 as will be described in more detail below and conveyed to the operator console 100 and presented on the display 104.

For a more detailed description of the transceiver 150, reference is made to U.S. Pat. Nos. 4,952,877 and 4,992,736 which are incorporated herein by reference.

The present invention enables the MRI system of FIG. 1 to be periodically tested to measure the eddy currents produced by the applied magnetic field gradient pulses. From the resulting spatial and temporal eddy current information, off-setting currents can be applied to shim coils (not shown in the drawings) which form part of the polarizing magnet 140, and to the gradient coils 139 themselves. This eddy current compensation is described in U.S. Pat. No. 4,950,994, issued Aug. 21, 1990 and entitled "Gradient and Polarizing Field Compensation," which is incorporated herein by reference.

Figure 2:
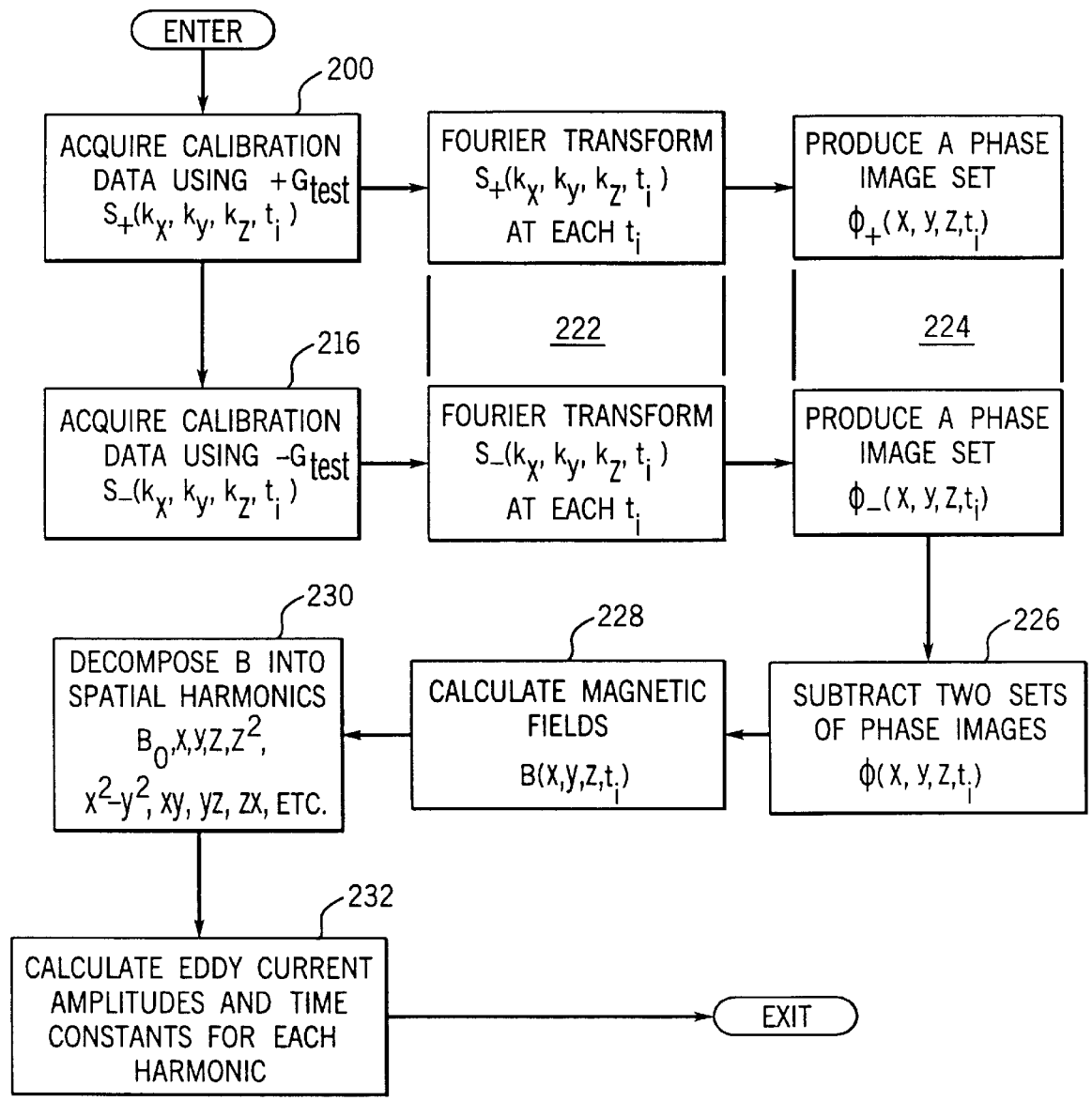
FIG. 2 is a flow chart of a program executed by the MRI system of FIG. 1 to carry out the preferred embodiment of the present invention.
Figure 3:
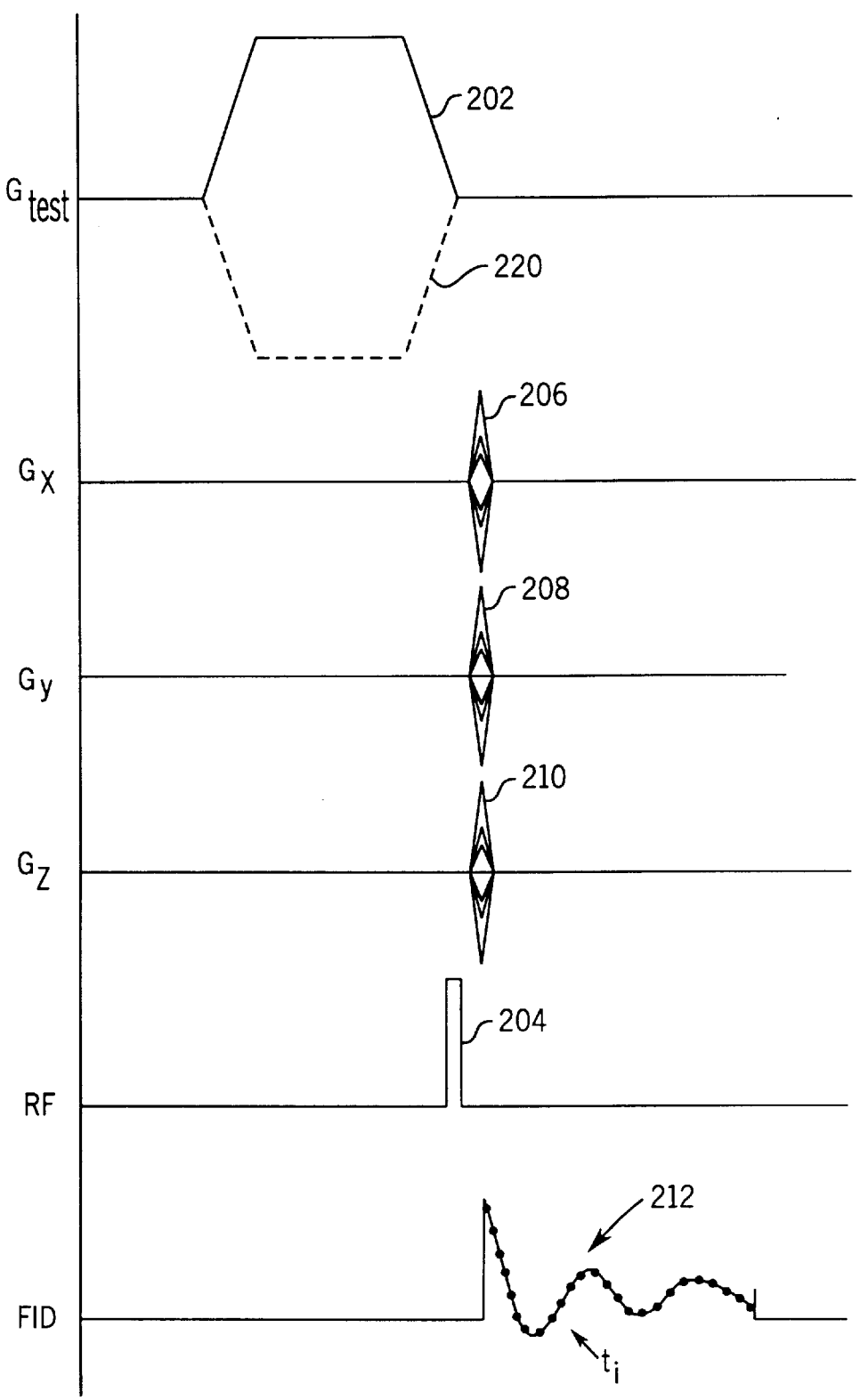
FIG. 3 is a graphic representation of a 3D calibration pulse sequence which is performed by the MRI system of FIG. 1.
Figure 8:
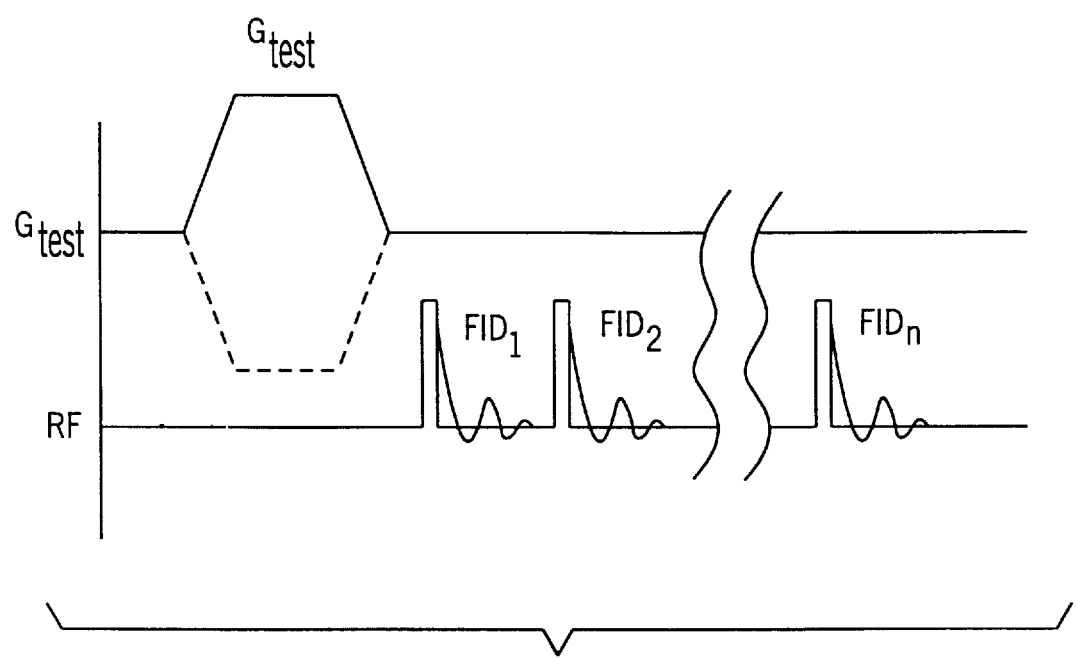
FIG. 8 is a graphic representation of an alternative calibration pulse sequence used to practice the present invention.

Referring particularly to FIG. 2, a calibration scan is performed in which test data are acquired. In this scan, a spherical phantom filled with water can be used to minimize the magnetic susceptibility effects. The size of the phantom is chosen to occupy the nominal imaging volume (e.g. 23–30 cm), and the water contained in the phantom is doped with paramagnetic ions, such as $Cu^{2+}$, to reduce the $T_1$ relaxation time. As indicated by process block 200, the first step is the acquisition of a calibration data set using the pulse sequence shown in FIG. 3 in which a positive test gradient pulse 202 is used. A non-selective RF excitation pulse 204 is applied to produce transverse magnetization throughout the region of interest (ROI), and three separate phase encoding gradient pulses 206, 208 and 210 are applied to phase encode the FID signal 212 along the respective x, y and z axes. The FID signal 212 is sampled at time $t_i$ for a time duration determined by the $T_2$ of the water contained in the phantom. For short $T_2$'s, the RF pulse can be shifted away from the test gradient, and the acquisition of FIDs may be repeated multiple times with different shifting intervals as shown in FIG. 8. A set of FIDs thus obtained is then concatenated to form one single FID covering a longer time duration. The acquisition of the FID (or the FID set) is repeated and the phase encoding gradients 206, 208 and 210 are stepped through values to sample three-dimensional k-space. A four dimensional NMR data set $S_+(k_x, k_y, k_z, t_i)$ is produced. In the preferred embodiment k-space is sampled 16–32 times along the $k_x$ axis, 16–32 times along the $k_y$ axis, and 16–32 times along the $k_z$ axis.

The purpose of the calibration scan is to measure the effects of the test gradient pulse 202 on the FID signal 212. However, because the phase encoding gradient pulses 206, 208, 210 will also induce eddy currents, their effect on the FID signal 212, as well as the effects of the static $B_0$ field inhomogeneities, must be offset. As indicated by process block 216, this is accomplished by repeating the calibration scan using the pulse sequence of FIG. 3, but with a test gradient pulse 220 that is reversed in polarity. This results in a second NMR data set $S_{31}(k_x, k_y, k_z, t_i)$. As indicated at process block 222, the two data sets $S_+$ and $S_{31}$ are individually Fourier transformed at each time point $t_i$ with $k_x$, $k_y$ and $k_z$ being the variables. This operation produces two sets of time-resolved images $I_+(x,y,z,t_i)$ and $I_{31}(x,y,z,t_i)$. The time-resolved images are complex in nature, each comprised of a real part U and an imaginary part V. The next step indicated at process block 224 is to convert the complex images into the corresponding phase images:

$$\phi_+(x,y,z,t_i) = \tan^{-1}\left[\frac{V_+(x,y,z,t_i)}{U_+(x,y,z,t_i)}\right], \tag{1a}$$

$$\phi_-(x,y,z,t_i) = \tan^{-1}\left[\frac{V_-(x,y,z,t_i)}{U_-(x,y,z,t_i)}\right]. \tag{1b}$$

The two sets of phase images, corresponding to the opposite gradient polarity, are then subtracted from each other at process block 226 to remove the effects of eddy currents arising from the phase-encoding gradients, as well as the static magnetic field inhomogeneities:

$$\phi(x,y,z,t_i) = [\phi_+(x,y,z,t_i) - \phi_{31}(x,y,z,t_i)]/2. \tag{2}$$

This yields a new set of phase-difference images whose values are related to the eddy currents produced by the test gradient $G_{test}$. Referring still to FIG. 2, the next step indicated at process block 228 is to calculate the time resolved magnetic field $B(x,y,z,t_i)$ that is produced by the eddy currents. This is accomplished by taking the time derivative of the phase images $\phi(x,y,z,t_i)$:

$$B_{t_i}(x,y,z) = \frac{\phi(x,y,z,t_{i+1}) - \phi(x,y,z,t_i)}{\gamma(t_{i+1} - t_i)} \tag{3}$$

where $(t_{i+1}-t_i)$ is the sampling interval of the FID signal, and $\gamma$ is the gyromagnetic ratio. At any given time $t_i$, the eddy current induced magnetic field $B_{t_i}(x,y,z)$ can be expressed as a summation of spherical harmonics:

$$B_{t_i}(x,y,z) = \sum_{m=-n}^{n} \sum_{n=0}^{\infty} r^n P_{mn}(\cos\theta)[C_{mn,t_i}\cos m\phi + D_{mn,t_i}\sin m\phi], \tag{4}$$

where $C_{mn,t_i}$ and $D_{mn,t_i}$ are constants, $P_{mn}$ is the associated Legendre function, $r,\theta$ and $\phi$ are the polar coordinates and are related to the Cartesian coordinates x,y, and z by:

$$x = r \sin\theta \cos\phi \tag{5a}$$

$$y = r \sin\theta \sin\phi \tag{5b}$$

$$z = r \cos\theta \tag{5c}$$

Using known spherical harmonic decomposition techniques, such as the one described by Chen and Hoult ("Biomedical Magnetic Resonance Technology", C-N Chen and D. I. Hoult, Institute of Physics Publishing, London, 1989), Eq. 4 can be further expressed as:

$$B_{t_i}(x,y,z) = \zeta_{00,t_i} + \zeta_{10,t_i}z + \zeta_{11,t_i}x + \zeta_{12,t_i}y +$$
$$\zeta_{20,t_i}z^2 + \zeta_{21,t_i}(x^2 - y^2) + \zeta_{22,t_i}xy + \zeta_{23,t_i}yz + \zeta_{24,t_i}zx +$$
$$\zeta_{30,t_i}z^3 + \ldots,$$

where the first subscript p of the spherical harmonic coefficient $\zeta_{pq,t_i}$ indicates the order of the spatial dependency, the second one q represents the q-th component for the given spatial order p, and the last subscript indicates the time-dependency of the coefficients. The total number of components for a given spatial order p is found to be 2p+1.

The same spherical decomposition process is repeated N-times at process block 230, each for a distinct time point $t_i(i=1, 2, \ldots, N)$. A full set of the coefficients thus obtained can be expressed as $\zeta_{pq}(t_i)$. According to Jehenson et al. (P. Jehenson, M. Westphal, and N. Schuff, J. Magn. Reson. 90, 264–278, 1990), each time-dependent coefficient $\zeta_{pq}(t_i)$ is related to the eddy current amplitude $\alpha_{pqj}$ and time constant $\tau_{pqj}$ by the following equations:

$$\zeta_{pq}(t) = \gamma \int_o^t \lambda_{pq}(t')dt', \quad (7a)$$

$$\lambda_{pq}(t) = \sum_j^0 \alpha_{pq,j} e^{-t/\tau_{pq,j}} * \frac{dG_{test}}{dt}, \quad (7b)$$

where * denotes convolution, and j represents the jth eddy current component.

The final step, as indicated by process block 232, is to calculate the spatially resolved eddy current amplitudes $\alpha_{pq,j}$ and time constants $\tau_{pq,j}$ so that the compensating currents can be applied to the gradient coils 139 and shim coils in the polarizing field coil 140. This is accomplished by first analytically carrying out the convolution and integration in Eq. 7, followed by exponential curve fitting of harmonic coefficients with time being the abscissa. The details of the multi-exponential fitting to extract $\alpha_{pq,j}$ and $\tau_{pq,j}$ from $\zeta_{pq}(t)$ can be found in U.S. Pat. Nos. 4,698,591 and 4,950,994 which are incorporated herein by reference.

The three-dimensional implementation of the present invention described above with reference to FIGS. 2 and 3 is the most generalized and accurate implementation. It provides compensation for any high order spatial variations in the gradient field. However, the complete three-dimensional implementation requires considerable time to complete. For example, it requires about two hours to calibrate an MRI system for up to the $4^{th}$ order variations using the three-dimensional implementation.

Figure 4:
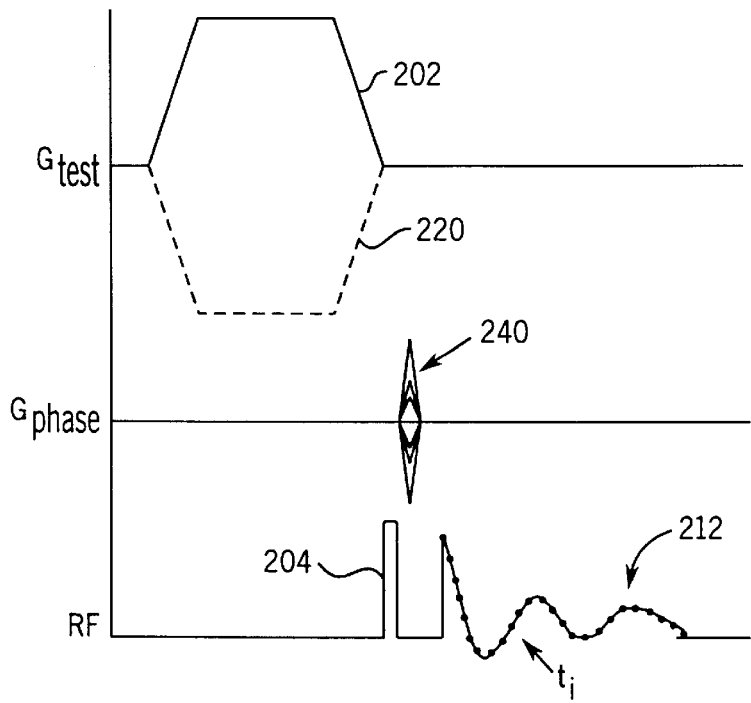
FIG. 4 is a graphic representation of an alternative 1D calibration pulse sequence which is performed by the MRI system of FIG. 1.

Another teaching of the present invention is that second order, or "quadratic", spatial variations in the gradient fields can be measured using three one-dimensional test scans. The pulse sequence in FIG. 4 is used in all three test scans. It is the same as the 3D pulse sequence described above, except only a single phase encoding pulse 240 is used. As a result, however, the calibration process using this second embodiment requires approximately 15 minutes to complete.

Figure 5:
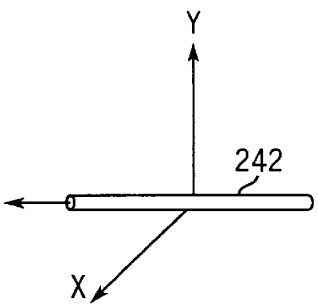
FIG. 5 is a schematic representation of a first phantom used with the calibration pulse sequence of FIG. 4.

As shown in FIG. 5, the first one-dimensional acquisition employs a thin rod 242 which is filled with water and positioned along the z-axis at the center of the MRI system. A $G_z$ phase encoding is used in the pulse sequence of FIG. 4 to acquire and produce a pair of image sets $I_{1,+}(z,t_i)$ and $I_{1,-}(z,t_i)$, corresponding to the positive and negative $G_{test}$, respectively, using the same sequence of steps described above. $I_{1,+}(z,t_i)$ and $I_{1,-}(z,t_i)$ can then be converted to a magnetic field map $B_1(z,t_i)$ using Eqs. 1–3. At any given time $t_i$, $B_1(z,t_i)$ can be expressed as a summation of zonal spherical harmonics, which can be derived from Eq. 4 with m=0:

$$B_{1,t_i}(z) = \sum_{n=0}^{\infty} \eta_{n,t_i} z^n. \quad (8)$$

A simple polynomial fitting with z being the abscissa gives all the zonal spherical harmonic coefficients $\eta_{n,t_i}$. If the same process is repeated for all the time points, a collection of $\eta_{n,t_i}$, denoted as $\eta_n(t_i)$, can be obtained. By fitting $\eta_n(t_i)$ to Eq. 7, the eddy current amplitudes and time constants for each and every zonal spherical harmonic components can be extracted. With the known eddy current amplitudes and time constants, compensation currents can be applied to the z-gradient coil, and the higher order shimming coils, such as $z^2, z^3, \ldots, Z^n$, using the method described in U.S. Pat. Nos. 4,698,591 and 4,590,994.

Figure 6:
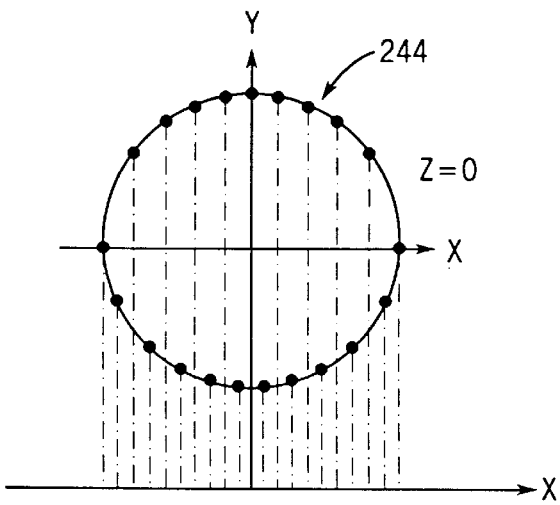
FIG. 6 is a schematic representation of a second phantom used with the calibration pulse sequence of FIG. 4.

In the second one dimensional calibration scan a phantom 244 depicted in FIG. 6 is used. This phantom 244 includes from 32 to 64 small water samples which are positioned around a ring concentric with the z axis and oriented in the x-y plane at the system isocenter. The samples are spaced around the ring 244 such that their x axis projections (or in the alternative y axis projection) are equally spaced along the x-axis. A second test scan using the pulse sequence of FIG. 4 is performed using a $G_x$ phase encoding gradient (or in the alternative $G_y$) to produce a second pair of calibration data sets $I_{2,+}(P_x(x,y),t_i)$ and $I_{2,-}(P_x(x,y),t_i)$, corresponding to the positive and negative $G_{test}$, respectively. In the above expression, $P_x(x,y)$ denotes the projection of the phantom along the x-direction. According to Eq. 4, the magnetic field map obtained from the two data sets at a given time $t_i$ can be expressed as:

$$B_{2,t_i}(x,y) = \sum_{m=-n}^{n} \sum_{n=0}^{\infty} R^n P_{mn}\left(\cos\frac{\pi}{2}\right) [C_{mn,t_i}\cos m\phi + D_{mn,t_i}\sin m\phi], \quad (9)$$

where R is the radius of the ring 244 in FIG. 6. For the component corresponding to m=1, we have $$\begin{aligned} b_{2,t_i,m=1} &= \left[ C_{11,t_i}R - \frac{3}{2}C_{13,t_i}R^3 + \ldots \right]\cos\phi + \\ &\quad \left[ D_{11,t_i}R - \frac{3}{2}D_{13,t_i}R^3 + \ldots \right]\sin\phi \\ &= \alpha_{1,t_i}\cos\phi + \beta_{1,t_i}\sin\phi \end{aligned} \quad (10)$$

From the real and imaginary parts of the first harmonic of the Fourier transform of $B_{2,t_i}(x,y)$, the coefficients $\alpha_{1,t_i}$ and $\beta_{1,t_i}$ can be obtained. Since $\cos\phi = x/R$ and $\sin\phi = y/R$, dividing $\alpha_{1,t_i}$ and $\beta_{1,t_i}$ by R produces the harmonic coefficients for x and y, respectively. Similarly, the component of $B_{2,t_i}(x,y)$ corresponding to m=2 is given as $$\begin{aligned} b_{2,t_i,m=2} &= \left[ 3C_{22,t_i}R^2 - \frac{15}{2}C_{24,t_i}R^4 \ldots \right]\cos 2\phi + \\ &\quad \left[ 3D_{22,t_i}R^2 - \frac{15}{2}D_{24,t_i}R^4 \ldots \right]\sin 2\phi \\ &= \alpha_{2,t_i}\cos 2\phi + \beta_{2,t_i}\sin 2\phi \end{aligned} \quad (11)$$

From the real and imaginary parts of the second harmonic of the Fourier transform of $B_{2,t_i}(x,y)$, the coefficients $\alpha_{2,t_i}$ and $\beta_{2,t_i}$ can be obtained. Since $\cos 2\phi = (x^2-y^2)/R^2$ and $\sin 2\phi = 2xy/R^2$, dividing $\alpha_{2,t_i}$ and $\beta_{2,t_i}$ by $R^2$ and $R^2/2$, respectively, yields the harmonic coefficients for $(x^2-y^2)$ and xy. Using this method, some higher order harmonics can also be obtained.

After obtaining all the harmonic coefficients at all the time points, the corresponding eddy current amplitudes and time constants can be extracted through curve fitting, and the compensation currents can be applied to the x and y-gradient coils and xy and $x^2-y^2$ shim coils, as described earlier.

Figure 7:
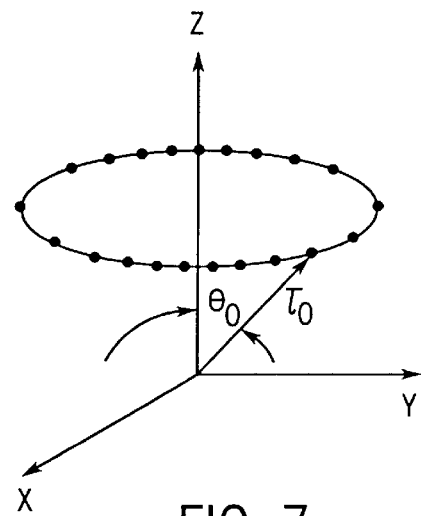
FIG. 7 is a schematic representation of the secondphantom in a different position when used with the pulse sequence of FIG. 4.

A third test scan uses the same phantom ring 244, but the ring 244 is re-positioned as shown in FIG. 7. More specifically, the phantom ring 244 is translated along the z axis, away from the xy-plane. The exact same test scan used to produce the second calibration data set is then repeated. A third pair of calibration data sets $I_{3,+}(P_x(x,y),t_i)$ and $I_{3,-}(P_x(x,y),t_i)$ are thus produced and used to calculate the remainder of the quadratic harmonic terms yz and zx. The magnetic field map obtained from $I_{3,+}$ and $I_{3,-}$p0 can be expressed as:

$$B_{3,t_i}(x,y) = \sum_{m=-n}^{n} \sum_{n=0}^{\infty} r_0^n P_{mn}(\theta_0)[C_{mn,t_i}\cos m\phi + D_{mn,t_i}\sin m\phi] \quad (12)$$

where $r_0$ and $\theta_0$ are indicated in FIG. 7. Performing a Fourier transform on $B_{3,t_i}$, the real and imaginary Fourier coefficients for the first Fourier harmonic are found to be:

$$\alpha_{3,t_i} = C_{11,t_i} r_0 \sin\theta_0 + 3/2 C_{12,t_i} r_0^2 \sin 2\theta_0 \ldots, \quad (13a)$$

$$\beta_{3,t_i} = D_{11,t_i} r_0 \sin\theta_0 + 3/2 D_{12,t_i} r_0^2 \sin 2\theta_0 \ldots, \quad (13b)$$

Ignoring the higher order terms beyond quadratic, from Eqs. 10 and 13 one obtains:

$$C_{12,t_i} = \frac{2(\alpha_{3,t_i} R - \alpha_{1,t_i} r_0 \sin\theta_0)}{3 r_0^2 \sin 2\theta_0}, \quad (14a)$$

$$D_{12,t_i} = \frac{2(\beta_{3,t_i} R - \beta_{1,t_i} r_0 \sin\theta_0)}{3 r_0^2 \sin 2\theta_0}. \quad (14b)$$

From Eq. 4, it can be seen that $3C_{12,t_i}$ and $3D_{12,t_i}$ are equal to the harmonic coefficients for xz and yz, respectively. A curve fitting with respect to time for each harmonic coefficient, as described previously, will give the eddy current amplitudes and time constants. With known eddy current amplitudes and time constants, the spatial eddy current components xz and yz can be compensated by supplying currents to the xz and yz shim coils. The spatially varying eddy currents up to the second order can thus be measured using three separate one dimensional calibration scans, and subsequently compensated by supplying currents to the corresponding $B_0$, three linear gradient, and five second order shim coils.

Using the present invention a pure phase-encoding technique is employed to produce a series of images which each represents a true "snap shot," instead of a time-average view of the spatially resolved eddy currents. The time resolution of the eddy current measurement is thus drastically improved over prior methods, and more accurate, higher order compensating currents can be calculated.

I claim:

1. A method for compensating the magnetic field of an MR system, the steps comprising:

a) acquiring a first calibration data set using a pulse sequence that includes:
applying a test gradient pulse of one polarity;
applying an RF excitation pulse to produce transverse magnetization in a region of interest;
applying a phase encoding gradient pulse; and
acquiring an NMR signal over a time period (T) following the application of the test gradient pulse and sampling it at times $t_i$;
wherein the pulse sequence is repeated a plurality of times and the phase encoding gradient pulse is stepped through preset values;

b) acquiring a second calibration data set using the same method as recited in step a), except the test gradient pulse that is applied has the opposite polarity;

c) Fourier transforming each of the two calibration data sets to produce two sets of spatially and temporally resolved phase images;

d) subtracting the second set of phase images from corresponding phase images in the first set phase images to form a phase-difference image set;

e) calculating eddy current compensating values based on the phase-difference images; and f) applying the compensation values to coils on the MR system during subsequent scans.

2. The method as recited in claim 1 in which step e) is performed by:

calculating the spatially and temporally resolved magnetic field based on the phase-difference images;

decomposing the calculated magnetic field into temporally resolved spatial harmonic coefficients;

extracting the eddy current amplitudes and time constants for each and every spatial harmonic component;

calculating the eddy current compensation values based on the eddy current amplitudes and time constants.

3. The method as recited in claim 1 in which the pulse sequence includes applying three phase encoding gradient pulses which are each stepped through preset values while acquiring said calibration data sets; and the Fourier transformation in step c) is a three-dimensional Fourier transformation which produces three-dimensional phase images.

4. The method as recited in claim 1 in which the steps a) through d) are repeated to produce a second set of phase-difference images, but with a phase encoding pulse in the pulse sequence that phase encodes along a different axis; and step e) is performed using both sets of phase-difference images.

5. The method as recited in claim 1 in which the set of phase-difference images includes a phase-difference image for each of said sampling times $t_i$.

* * * * *